United States Patent [19]

Steinmann et al.

[11] Patent Number: 5,487,966
[45] Date of Patent: Jan. 30, 1996

[54] PHOTOSENSITIVE COMPOSITIONS

[75] Inventors: Bettina Steinmann, Praroman; Adrian Schulthess, Tentlingen; Max Hunziker, Düdingen, all of Switzerland

[73] Assignee: Ciba-Geigy Corporation, Tarrytown, N.Y.

[21] Appl. No.: 231,953

[22] Filed: Apr. 21, 1994

Related U.S. Application Data

[63] Continuation of Ser. No. 891,540, Jun. 1, 1992, abandoned.

[30] Foreign Application Priority Data

Jun. 4, 1991 [CH] Switzerland ............... 1667/91

[51] Int. Cl.$^6$ ............ G03C 5/00; G03C 1/492; G03C 1/725
[52] U.S. Cl. .......... 430/269; 430/270.14; 430/280.1; 430/281.1; 430/285.1; 430/107
[58] Field of Search ................... 430/269, 270, 430/280, 281, 285; 522/107

[56] References Cited

U.S. PATENT DOCUMENTS

| | | | |
|---|---|---|---|
| 3,878,076 | 4/1975 | Nishikubo et al. | 204/159.15 |
| 4,100,141 | 7/1978 | O'Sullivan | 526/301 |
| 4,575,330 | 3/1986 | Hull | 430/269 |

FOREIGN PATENT DOCUMENTS

| | | |
|---|---|---|
| 0171069 | 2/1986 | European Pat. Off. |
| 0223587 | 5/1987 | European Pat. Off. |
| 0378144 | 7/1990 | European Pat. Off. |
| 1265414 | 4/1968 | Germany |
| 2057884 | 11/1969 | Germany |

OTHER PUBLICATIONS

Chemical Abstract (of German 2,057,844) No. 77764h, vol. 75, 1971.
Chemical Abstract, vol. 68, 1968, No. 105762g (of German 1,265,414).
CA. vol. 82, 1975, 100209m.
CA. vol. 107, 1987, 8489q.
Rev. Sci. Instram. 52(11) 1770 (1981).

*Primary Examiner*—Mark A. Chapman
*Attorney, Agent, or Firm*—William A. Teoli, Jr.

[57] ABSTRACT

Photosensitive compositions comprising
a) 5–95% by weight of a polyester of formula I, II or III

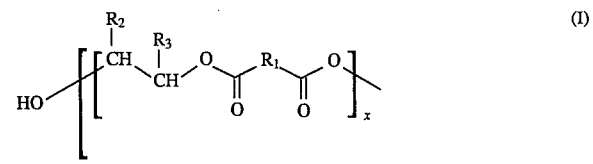
(I)

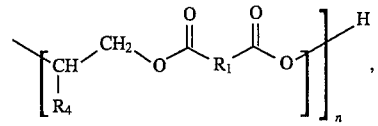

-continued
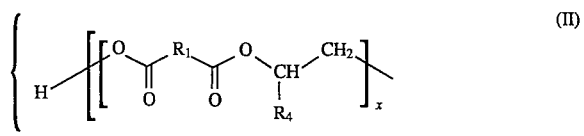
(II)

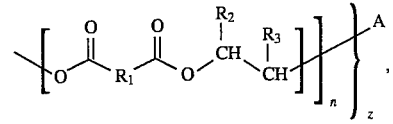

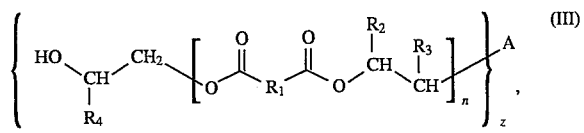

(III)

wherein $R_1$ is the radical of a cyclic anhydride of a dicarboxylic acid after removal of the —O—CO—O— grouping, which radical may be substituted by $C_1$–$C_{22}$alkyl, $C_5$–$C_{10}$cycloalkyl, $C_3$–$C_6$alkenyl, $C_6$–$C_{10}$aryl, halogen or $C_1$–$C_{22}$alkyl which is interrupted by —O— or —CO—O—, $R_2$ is hydrogen, unsubstituted or halogen-substituted $C_1$–$C_{22}$alkyl, $C_5$–$C_{10}$cycloalkyl, $C_7$–$C_{22}$aralkyl, $C_6$–$C_{10}$aryl or a radical —$CH_2$—O—$R_5$ or —$CH_2$—O—CO—$R_5$, wherein $R_5$ is $C_1$–$C_{22}$alkyl, $C_5$–$C_6$cycloalkyl or $C_6$–$C_{10}$aryl, $R_3$ is hydrogen, or $R_2$ and $R_3$, together with the linking carbon atoms, are a cyclopentylene or cyclohexylene radical, $R_4$ is a radical of 4 to 12 carbon atoms which carries an unsaturated end group and carboxyl or ether groups, A is a mono- or polyfunctional low molecular or high molecular carboxylate or alcoholate, x is an integer from 0–100, n is an integer from 2–150, and z is an integer from 1–4, b) 10–90% by weight of a liquid polyfunctional aliphatic, cycloaliphatic or aromatic (meth)acrylate, c) 0–70% of a mono(meth)acrylate or mono-N-vinyl compound with a molecular weight of not more than 500, d) 0.1–10% by weight of a photoinitiator, and e) 0–10% by weight of optional customary additives.

15 Claims, No Drawings

PHOTOSENSITIVE COMPOSITIONS

This application is a continuation of application Ser. No. 07/891,540, filed Jun. 1, 1992, now abandoned.

The present invention relates to photosensitive compositions, to novel polyesters, to a process for polymerising said compositions with actinic light, to a process for the production of three-dimensional objects from said photosensitive compositions, and to the use of these compositions for producing photopolymerised layers, especially three-dimensional objects which are composed of a plurality of photopolymerised layers.

It is known that radiation-sensitive liquid resins or resin compositions have versatile utilities, typically as coating compositions, adhesives or photoresists. In principle, liquid resins or resin systems should quite generally also be suitable for forming three-dimensional objects by the stereolithographic technique disclosed in U.S. Pat. No. 4,575,330. However, many resins prove to be too viscous, whereas others are too insufficiently light-sensitive or, during the cure, suffer too severe shrinkage. The strength properties of the moulded articles or objects fabricated from photocured resins are also often unsatisfactory.

That complicated three-dimensional objects can be formed from liquid light-sensitive resins by the stereolithographic technique is well-known. Such objects are formed from layers by bonding each new curable resin layer tenaciously to the previously prehardened layer by curing with UV/VIS light. It is common knowledge that the total assembly of the three-dimensional object can be accomplished by means of a computer-controlled process.

In recent years there has been no lack of efforts to develop resin systems suitable for the technique of stereolithography. In Rev. Sci. Instrum. 52 (11) 1170–1173 (1981), H. Kodama discloses under the registered trademark "Tevista" a liquid photohardening resin composition comprising an unsaturated polyester, acrylate, styrene, a polymerisation initiator and a sensitiser. The drawback of this resin system for use in stereolithography is that the photosensitivity is insufficient and the so-called "green strength" of the objects hardened by laser beams is rather low.

A stereolithographic method is described in U.S. Pat. No. 4,575,330 in which the liquid resin used is a modified acrylate which is referred to in the description as "Potting Compound 363". Such resin compositions are disclosed in U.S. Pat. No. 4,100,141. They too have the drawback of being insufficiently light-sensitive and of requiring lengthy times for the fabrication of three-dimensional objects by the stereolithographic technique.

Moreover, those skilled in the art know that the known polyester, polyether or polyurethane (meth)acrylates normally have a (meth)acrylate functionality of about 2.

It is therefore understandable that the demands made of resins for use in stereolithography are high. For example, they must have a viscosity suitable for processing in the intended apparatus. The photosensitivity of the resin system must be such that the ratio of the radiation energy applied and the depth of penetration into the liquid photosensitive resin composition so as to effect solidification of the parts is within reasonable limits. This means that, when using a resin suitable for use in stereolithography, the aim shall be to achieve the greatest possible curing depth with little radiation energy, simultaneously coupled with a high degree of polymerisation and good green strength.

In the technique employed in stereolithography of successively polymerising thin layers, none of the layers is usually fully cured. The incompletely cured object is called a "green object", and the module of elasticity and the tensile strength of this green object is called the green strength. Normally the green object is cured with UV/VIS light, conveniently with a mercury or xenon arc lamp. The green strength of an object is therefore an important parameter, as objects having a low green strength may become deformed under their own weight or, in the course of the cure, they may sag or collapse.

It has now been found that compositions comprising a plurality of different (meth)acrylates and additionally comprising a polyester whose molecular weight and (meth)acrylate functionality are capable of variation within wide limits, can be used for stereolithography. The irradiation is thus able to produce crosslinking densities of differing strength, so that not only the green objects formed by precuring with laser beams but also the objects obtained by curing the green objects have properties which are capable of variation within wide limits.

Specifically, the invention relates to a photosensitive composition comprising a) 5–95% by weight of a polyester of formula I, II or III

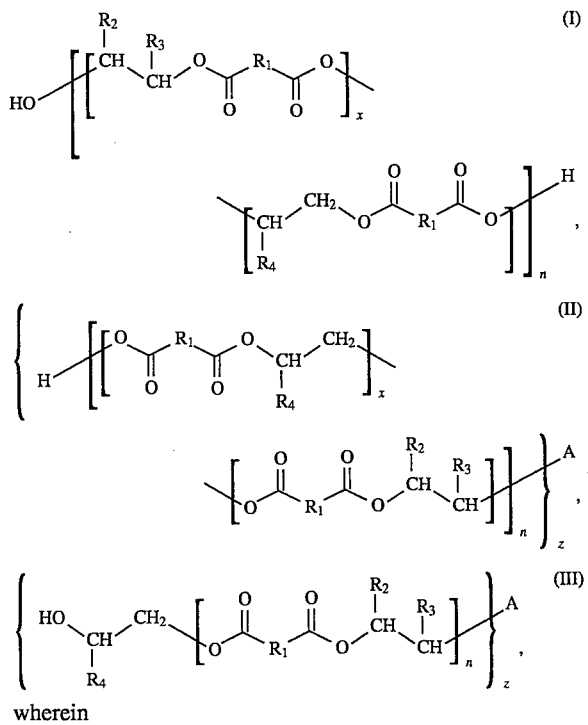

wherein $R_1$ is the radical of a cyclic anhydride of a dicarboxylic acid after removal of the —O—CO—O— grouping, which radical may be substituted by $C_1$–$C_{22}$alkyl, $C_5$–$C_{10}$cycloalkyl, $C_3$–$C_6$alkenyl, $C_6$–$C_{10}$aryl, halogen or $C_1$–$C_{22}$alkyl which is interrupted by —O— or —CO—O—, $R_2$ is hydrogen, unsubstituted or halogen-substituted $C_1$–$C_{22}$alkyl, $C_5$–$C_{10}$cycloalkyl, $C_7$–$C_{12}$aralkyl, $C_6$–$C_{10}$aryl or a radical —$CH_2$—O—$R_5$ or —$CH_2$—O—CO—$R_5$, wherein $R_5$ is $C_1$–$C_{22}$alkyl, $C_5$–$C_6$cycloalkyl or $C_6$–$C_{10}$aryl, $R_3$ is hydrogen, or $R_2$ and $R_3$, together with the linking carbon atoms, are a cyclopentylene or cyclohexylene radical, $R_4$ is a radical of 4 to 12 carbon atoms which carries an unsaturated end group and carboxyl or ether groups, A is a mono- or polyfunctional low molecular or high molecular carboxylate or alcoholate, x is an integer from 0–100, n is an integer from 2–150, and z is an integer from 1–4, b) 10–90% by weight of a liquid polyfunctional aliphatic, cycloaliphatic or aromatic (meth)acrylate, c) 0–70% of a mono(meth)acrylate or mono-N-vinyl compound with a molecular weight of not more than 500, d) 0.1–10% by weight of a photoinitiator, and e) 0–10% by weight of optional customary additives.

A substituent defined as $C_1$–$C_{22}$alkyl may typically be linear or branched. For example, said substituents may be methyl, ethyl, n-propyl, isopropyl, n-butyl, sec-butyl, isobutyl, pentyl, hexyl, heptyl, octyl, nonyl, decyl, undecyl, dodecyl, tetradecyl, hexadecyl, icosyl or docosyl.

A substituent defined as $C_5$–$C_{10}$cycloalkyl may typically be cyclopentyl, cyclohexyl, cycloheptyl, cyclooctyl, cyclononyl or cyclodecyl.

A substituent defined as $C_3$–$C_6$alkenyl may typically be 1-methylethenyl, 1-propenyl, 2-propenyl (allyl), as well as the different butenyl, pentenyl or hexenyl isomers.

A substituent defined as $C_6$–$C_{10}$aryl may typically be phenyl or naphthyl.

A halogen substituent may typically be fluoro, chloro, bromo or iodo.

A substituent defined as $C_7$–$C_{12}$aralkyl will suitably be benzyl, 2-phenylethyl, 3-phenylpropyl or 4-phenylbutyl.

The photosensitive composition preferably comprises a) 30–80% by weight of a polyester of formula I, II or III, b) 20–70% by weight of a liquid polyfunctional aliphatic, cycloaliphatic or aromatic (meth)acrylate, c) 0–50% by weight of a mono(meth)acrylate or mono-N-vinyl compound with a molecular weight of not more than 500, d) 0.5–7% by weight of a photoinitiator, and e) 0–5% by weight of optional customary additives.

The polyesters used as component a) of the inventive compositions can be prepared in a manner which is known per se. Polyesters of formula I may typically be prepared by copolymerising the corresponding cyclic anhydrides with monoepoxides, at least one of which epoxides must contain a radiation-curable unsaturated group. Initiators which may suitably be used for this polymerisation are tertiary amines, metal alkoxides or salts of Brønsted acids. Polyesters of formula II may conveniently be obtained by copolymerising the corresponding cyclic anhydrides and monoepoxides together with salts of mono- or polyfunctional acids or alcohols, at least one of which epoxides must contain a radiation-curable unsaturated group. Polyesters of formula III may conveniently be obtained by copolymerising the corresponding cyclic anhydrides and monoepoxides together with salts of mono- or polyfunctional acids or alcohols, which are then additionally reacted in the same step with an unsaturated monoepoxide. It has been found that soluble polyesters are obtained by adding nitrobenzene or nitromethane as inhibitor for preventing gelation (by polymerisation of the double bonds).

Many of the polyester components a) are known compounds and are disclosed, inter alia, in JP Kokai 49-086490 and 62-005853. Some of the compounds, however, are novel. Accordingly, the invention relates to polyesters of formulae II and III indicated above, wherein the substituents $R_1$, $R_2$, $R_3$, $R_4$, $R_5$ and A, as well as x, n and z have the meanings previously assigned to them.

Preferred photosensitive compositions are those wherein $R_1$ is a radical of formula

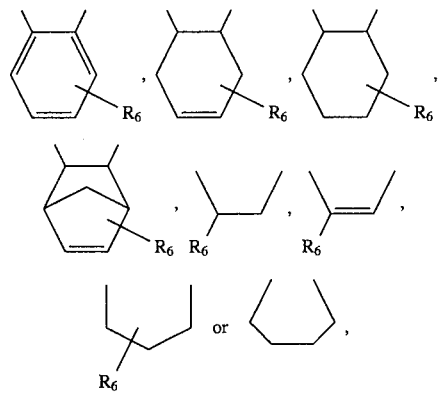

wherein $R_6$ is hydrogen, $C_1$–$C_{22}$alkyl, $C_5$–$C_{10}$cycloalkyl, $C_3$–$C_6$alkenyl, $C_6$–$C_{10}$aryl, halogen or $C_1$–$C_{22}$alkyl which is interrupted by —O— or —CO—O—.

Particularly preferred photosensitive compositions are those wherein $R_1$ is a radical of formula

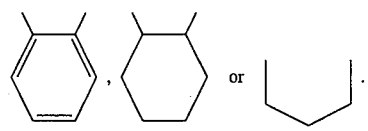

Further preferred photosensitive compositions are those wherein $R_2$ is hydrogen, methyl, n-butyl, $H_3C$—$(CH_2)_3$—O—$CH_2$— or a radical of formula

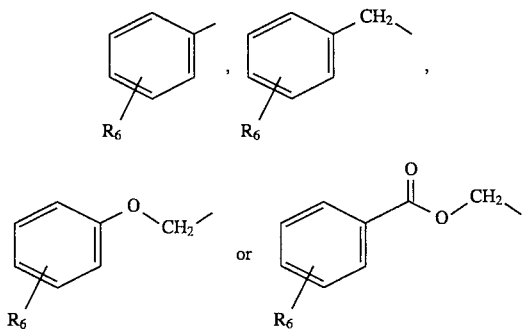

or wherein $R_2$ and $R_3$, when taken together, form an unsubstituted or $R_6$-substituted tetramethylene radical, wherein $R_6$ is as defined previously.

Especially preferred photosensitive compositions are those wherein $R_2$ is n-butyl, $H_3C$—$(CH_2)_3$—O—$CH_2$— or a radical of formula

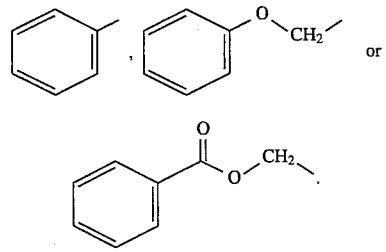

$R_4$ contains at least one carboxyl or ether group. Preferred photosensitive compositions are also those wherein $R_4$ is a radical of formula

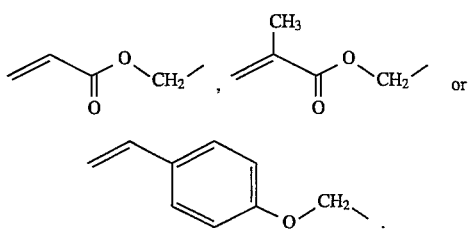

Preferred photosensitive compositions are also those wherein A is a radical $H_3C—(CH_2)_y—CO—O—$, $H_3C—(CH_2)_y—O—$, $—O—CO—(CH_2)_y—CO—O—$, $—O—(CH_2)_y—O—$ or

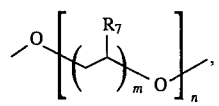

wherein $R_7$ is methyl or hydrogen if m=1 or, if m=2–4, is hydrogen, n=2–150 and y is an integer from 2–20, or wherein A is a radical derived from linear or branched polyethylene glycols or polypropylene glycols or copolymers of these two glycols or carboxyl-terminated polyesters.

Particularly preferred photosensitive compositions are those wherein A is a radical $—O—CO—(CH_2)_y—CO—O—$ or $—O—(CH_2)_y—O—$, where y is as defined previously, or wherein A is a radical derived from linear or branched polyethylene glycols or polypropylene glycols or copolymers of these two glycols or carboxyl-terminated polyesters.

The liquid polyfunctional aliphatic, cycloaliphatic or aromatic (meth)acrylates used as component b) of the novel compositions may typically be di-, tri-, tetra- or pentafunctional monomeric or oligomeric acrylate or methacrylate esters.

Preferred photosensitive compositions are those wherein component b) is a di(meth)acrylate and a tri(meth)acrylate.

Suitable aliphatic or cycloaliphatic di(meth)acrylates are the diacrylate and dimethacrylate esters of aliphatic or cycloaliphatic diols, including 1,3-butanediol, 1,4-butanediol, neopentyl glycol, 1,6-hexanediol, diethylene glycol, triethylene glycol, tetraethylene glycol, polyethylene glycol 400, polyethylene glycol 600, tripropyleneglycol, ethoxylated or propoxylated neopentyl glycol, 1,4-dihydroxymethylcyclohexane, 2,2-bis(4-hydroxycyclohexyl)propane or bis(4-hydroxycyclohexyl)methane.

Suitable aliphatic polyfunctional (meth)acrylates are the triacrylate and trimethacrylate ester of hexane-2,4,6-triol, glycerol or 1,1,1-trimethylolpropane, ethoxylated or propoxylated glycerol or 1,1,1-trimethylolpropane and the hydroxy group containing tri(meth)acrylates which are obtained by reacting triepoxide compounds, conveniently the triglycidyl ethers of the above triols, with (meth)acrylic acid. It is also possible to use pentaerythritol tetraacrylate, bis(trimethylol)propane tetraacrylate, pentaerythritol monohydroxy tri(meth)acrylate or dipentaerythritol monohydroxy penta(meth)acrylate.

Suitable aromatic di- and tri(meth)acrylates are the reaction products of di- or triglycidyl ethers of dihydric or trihydric phenols, typically resorcinol, hydroquinone, bis(4-hydroxyphenyl)methane, 4,4'-dihydroxydiphenyl, bis(4-hydroxyphenyl)sulfone, 1,1,2,2-tetrakis-(4-hydroxyphenyl)ethane, 2,2-bis(4-hydroxyphenyl)propane, ethoxylated or propoxylated 2,2-bis(4-hydroxyphenyl)propane and 2,2-bis(3,5-dibromo-4-hydroxyphenyl)propane and phenol or cresol novolaks containing three hydroxy groups with (meth)acrylic acid.

It is also possible to use urethane acrylates or urethane methacrylates. These urethane (meth)acrylates are known to those skilled in the art and can be prepared in known manner, conveniently by reacting a hydroxyl-terminated polyurethane with acrylic acid or methacrylic acid to the corresponding urethane (meth)acrylate, or by reacting an isocyanate-terminated prepolymer with hydroxyalkyl-(meth)acrylates to the urethane (meth)acrylate. Suitable processes are disclosed, inter alia, in EP-A 114 982 and 133 908. The molecular weight of such (meth)acrylates is normally in the range from 400 to 10 000, preferably from 500 to 7 000.

The (meth)acrylates used as component b) are known compounds and some are commercially available, for example from the SARTOMER Company.

Component c) of the novel compositions may be selected from the following compounds: allyl acrylate, allyl methacrylate, methyl (meth)acrylate, ethyl (meth)acrylate, n-propyl (meth)acrylate, n-butyl (meth)acrylate, isobutyl (meth)acrylate, n-hexyl (meth)acrylate, 2-ethylhexyl(meth)acrylate, n-octyl (meth)acrylate, n-decyl(meth)acrylate and n-dodecyl (meth)acrylate, 2-hydroxyethyl(meth)acrylate, 2- and 3-hydroxypropyl (meth)acrylate, 2-methoxyethyl(meth)acrylate, 2-ethoxyethyl(meth)acrylate and 2- or 3-ethoxypropyl (meth)acrylate, tetrahydrofurfuryl methacrylate, 2-(2-ethoxyethoxy)ethyl acrylate, cyclohexylmethacrylate, 2-phenoxyethyl(meth)acrylate, glycidyl-(meth)acrylate and isodecyl acrylate; and the mono-N-vinyl compound is N-vinylpyrrolidone or N-vinylcaprolactam. Such products are likewise known and some are commercially available, for example from the SARTOMER Company.

The compounds suitable for use as component (c) preferably have a $M_w$ von 50–300.

Component (c) of the novel compositions is preferably a mono-N-vinyl compound, more particularly N-vinylpyrrolidone.

Any type of photoinitiator which, when irradiated suitably, forms free radicals can be employed as component (d) in the novel compositions. Typical known photoinitiators are benzoins, including benzoin, benzoin ethers, such as benzoin methyl ether, benzoin ethyl ether and benzoin isopropyl ether, benzoin phenyl ether and benzoin acetate, acetophenones, including acetophenone, 2,2-dimethoxyacetophenone and 1,1-dichloroacetophenone, benzil, benzil ketals, such as benzil dimethyl ketal and benzil diethyl ketal, anthraquinones, including 2-methylanthraquinone, 2-ethylanthraquinone, 2-tert-butylanthraquinone, 1-chloroanthraquinone and 2-amylanthraquinone, triphenylphosphine, benzoylphosphine oxides, for example 2,4,6-trimethylbenzoyldiphenylphosphine oxide (Luzirin TPO), benzophenones, such as benzophenone and 4,4'-bis(N,N'-dimethylamino)benzophenone, thioxanthones and xanthones, acridine derivatives, phenazine derivatives, quinoxaline derivatives or 1-phenyl-1,2-propanedione, 2-O-benzoyl oxime, 1-aminophenyl ketones or 1-hydroxyphenyl ketones, such as 1-hydroxycyclohexyl phenyl ketone, phenyl 1-hydroxyisopropyl ketone and 4-isopropylphenyl 1-hydroxyisopropyl ketone, all of which are known compounds.

Particularly suitable photoinitiators which are normally used in combination with a HeCd laser as radiation source are acetophenones, conveniently 2,2-dialkoxybenzophenones and 1-hydroxyphenyl ketones, for example 1-hydroxycyclohexyl phenyl ketone or 2-hydroxyisopropyl phenyl ketone (=2-hydroxy-2,2-dimethylacetophenone). 1-Hydroxycyclohexyl phenyl ketone is especially preferred.

Another class of photoinitiators (d) which are normally employed when irradiating with argon ion lasers are the benzil ketals, typically benzil dimethyl ketal. Preferably the photoinitiator is an α-hydroxyphenyl ketone, benzil dimethyl ketal or 2,4,6-trimethylbenzoyldiphenylphosphine oxide or a mixture of these initiators.

Another class of suitable photoinitiators (d) comprises the ionic dye-counter ion compounds which are capable of absorbing actinic radiation and generating free radicals which are able to initiate the polymerisation of the acrylates. The novel compositions containing ionic dye-counter ion compounds can be cured more variably in this way with visible light within the adjustable wavelength range of 400–700 nm. Ionic dye-counter ion compounds and their mode of action are known, for example from EP-A-0 223 587 and U.S. Pat. Nos. 4,751,102; 4,772,530 and 4,772,541. Typical examples of suitable ionic dye-counter ion compounds are the anionic dye-iodonium ion complexes, the anionic dye-pyrylium ion complexes and, especially, the cationic dye-borate anion compounds of formula

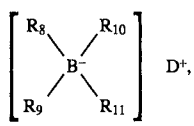

wherein $D^+$ is a cationic dye and $R_8$, $R_9$, $R_{10}$ and $R_{11}$ are each independently of one another alkyl, aryl, alkaryl, allyl, aralkyl, alkenyl, alkynyl, an alicyclic or saturated or unsaturated heterocyclic group. Preferred definitions of the substituents $R_8$ to $R_{11}$ will be found in EP-A-223 587.

It is common practice to add the photoinitiators in effective amounts, i.e. in amounts of about 0.1 to 10% by weight, based on the total amount of the composition. If the novel compositions are used for stereolithographic methods in which laser beams are normally used, it is essential to adjust the absorption capacity of the mixtures by the type and concentration of the photoinitiator such that the depth of cure at normal laser speed is about 0.1 to 2.5 ram.

The novel compositions may also contain other photoinitiators of different sensitivity to radiation of emission lines of different wavelengths. The inclusion of such photoinitiators effects the better utilisation of a UV/VIS light source which radiates emission lines of different wavelength. It is advantageous to choose these other photoinitiators and to use them in such concentration that a uniform optical absorption is produced with respect to the emission lines used.

The photoinitiator (d) in the novel compositions is preferably a 1-hydroxyphenyl ketone, more particularly 1-hydroxycyclohexyl phenyl ketone.

If desired, customary additives (e) can be added to the compositions of this invention, typically stabilisers such as UV stabilisers, polymerisation inhibitors, slip agents, wetting agents, flow control agents, sensitisers, antiprecipitants, surfactants, dyes, pigments or fillers.

The compositions can be prepared in known manner, conveniently by premixing individual components and subsequently blending these premixes, or by blending all components in conventional apparatus, such as stirred vessels, preferably excluding light and at ambient or slightly elevated temperature.

The novel photosensitive compositions can be polymerised by irradiation with actinic light, typically with electron beams, X-rays, UV or VIS light, i.e. with electromagnetic or particle radiation in the wavelength range from 280–650 nm. Particularly suitable light sources are HeCd, argon or nitrogen laser light as well as metal vapour and NdYAG lasers with multiple frequency. Those skilled in the art will know that the appropriate photoinitiator for each selected light source must be chosen and, if necessary, sensitised. It has been found that the depth of penetration of the radiation into the polymerised composition and the processing rate are directly related to the absorption coefficient and the concentration of the photoinitiator. In stereolithography it is preferred to use those photoinitiators which generate the highest number of resulting free radicals and make possible the greatest depth of penentration into the compositions to be polymerised.

Accordingly, the invention also relates to a process for polymerising the novel compositions by irradiating said compositions with actinic light. The resultant polymers may be used conveniently as coating compounds, photoresists or adhesives.

It was unexpected that the polyester component a) of the novel compositions are very readily compatible with the conventional (meth)acrylates which are used for formulating radiation-curable compositions. In addition, the polyesters obtained in more solid form also dissolve readily in the corresponding (meth)acrylate compositions. Surprisingly, the novel compositions also have high photosensitivity.

The invention further relates to a process for the production of three-dimensional objects from a novel liquid composition by lithographic methods, especially by stereolithography, in which a layer of novel liquid composition is irradiated over the entire surface or in a predetermined pattern with a UV/VIS light source, such that within the irradiated areas a layer solidifies in a desired layer thickness, then a new layer of novel composition is formed on the solidified layer, which is likewise irradiated over the entire surface or in a predetermined pattern, and such that three-dimensional objects are formed from a plurality of solidified layers which adhere to one another by repeated coating and irradiation.

In this process it is preferred to use a laser light which is preferably computer-controlled.

If the novel compositions are used as coating compounds clear and hard coats are obtained on wood, paper, metal, ceramic or other surfaces. The coating thickness can vary greatly over a very wide range and be from c. 1 μm to c. 1 mm. Relief images for printed circuit boards or printing plates can be produced from the novel compositions, conveniently by computer-controlled laser light of appropriate wavelength or using a photomask and a suitable light source.

A further utility of the novel compositions is as photocurable adhesives.

It is preferred to use the novel compositions for the production of photopolymerised layers, especially in the form of three-dimensional objects which are formed from a plurality of solidified layers which adhere to one another.

The following Examples illustrate the invention in more detail.

I. Preparation of the Polyesters (Component a)

Polyester I 2.5 g (0.0176 mol) of glycidyl methacrylate are placed in a dry round flask under $N_2$. Then 2.64 g (0.0178 mol) of phthalic anhydride and 28.8 mg (0.35 mmol) of 1-methylimidazole are added, also under $N_2$. After addition of 0.1 g of nitrobenzene and 10 ml of dry distilled toluene, the mixture is stirred at 80° C. until the epoxide groups are completely reacted. After a reaction time of 30 hours, the product is precipitated with ether, then reprecipitated from acetone/ether (1:1) and dried, giving a white powder.

Yield: 2.7 g (54% of theory);

$M_n=4\,000$, $M_w=8\,400$.

Polyester II

In accordance with the procedure described in Example I, the following components are mixed in a dry round flask under $N_2$:

| | |
|---|---|
| 20.0 g | of phenyl glycidyl ether (0.133 mol) |
| 1.89 g | of glycidyl methacrylate (0.0133 mol) |
| 21.65 g | of phthalic anhydride (0.146 mol) |
| 0.24 g | of 1-methylimidazole (0.0029 mol) |
| 40 ml | of toluene |
| 0.84 g | of nitrobenzene. |

The solution is stirred for 24 hours under $N_2$ at 80° C. The very viscous solution is then diluted with 100 ml of methylene chloride and the product is precipitated with 500 ml of ether. The oily yellow product is reprecipitated from methylene chloride/ether (1:1) and dried, giving a white powder.

Yield: 21.0 g (48% of theory);

$M_n=11\,800$, $M_w=14\,400$;

$T_g=48°–56°$ C.;

double bond value: 0.3 eq./kg.

Polyester III

In accordance with the procedure described in Example 1, the following components are mixed in a dry round flask under $N_2$:

| | |
|---|---|
| 20.0 g | of phenyl glycidyl ether (0.133 mol) |
| 1.70 g | of glycidyl acrylate (0.0133 mol) |
| 21.65 g | of phthalic anhydride (0.146 mol) |
| 0.24 g | of 1-methylimidazole (0.0029 mol) |
| 40 ml | of toluene |
| 0.84 g | of nitrobenzene. |

The solution is stirred for 24 hours under $N_2$ at 80° C. The product is precipitated with ether and reprecipitated from acetone/ether (1:1) and dried, giving a white powder. Yield: 32.2 g (77.4% of theory);

$M_n=6\,500$, $M_w=11\,400$;

double bond value: 0.4 eq./kg.

Polyester IV

In accordance with the procedure described in Example 1, the following components are mixed in a dry round flask under $N_2$:

| | |
|---|---|
| 13.3 g | of butyl oxirane (0.133 mol) |
| 8.45 g | of glycidyl acrylate (0.066 mol) |
| 23.96 g | of glutamic anhydride (0.21 mol) |
| 0.32 g | 1-methylimidazole (0.004 mol) |
| 50 ml | of toluene |
| 0.5 g | of nitrobenzene. |

The solution is stirred for 24 hours under $N_2$ at 80° C. The solvent is then removed on a rotary evaporator, the residue is washed with ether and then dried, giving a yellowish liquid resin.

Yield: 35 g (75% of theory);

$M_n=1\,600$, $M_w=2\,100$;

Polyester V

In accordance with the procedure described in Example 1, the following components are mixed in a dry round flask under $N_2$:

| | |
|---|---|
| 30.0 g | of phenyl glycidyl ether (0.2 mol) |
| 12.8 g | of glycidyl acrylate (0.1 mol) |
| 48.6 g | of hexahydrophthalic anhydride (0.31 mol) |
| 0.48 g | of 1-methylimidazole (0.006 mol) |
| 60 ml | of toluene |
| 0.92 g | of nitrobenzene. |

The solution is stirred for 24 hours under $N_2$ at 80° C. The product is precipitated with ether and reprecipitated from methylene chloride/ether (1:1) and dried, giving a beige powder.

Yield: 52.3 g (57.4% of theory);

$M_n=1\,800$, $M_w=2\,800$.

Polyester VI

In accordance with the procedure described in Example 1, the following components are mixed in a dry round flask under $N_2$:

| | |
|---|---|
| 39.7 g | of butyl glycidyl ether (0.305 mol) |
| 19.53 g | of glycidyl acrylate (0.15 mol) |
| 55.0 g | of glutamic anhydride (0.48 mol) |
| 0.73 g | of 1-methylimidazole (0.009 mol) |
| 110 ml | of toluene |
| 1.15 g | of nitrobenzene. |

The solution is stirred for 20 hours under $N_2$ at 80° C. The product is then extracted with a 5% aqueous solution of $NaHCO_3$ and the organic phase is concentrated under vacuum, giving a viscous yellow liquid.

Yield: 50.3 g (44% of theory);

$M_n=530$, $M_w=700$.

Polyester VII 13.02 g (0.1 mol) of butyl glycidyl ether are mixed with 13.7 g (0.12 mol) of glutaric anhydride and 0.16 g (0.001 tool) of the disodium salt of succinic acid under $N_2$. The mixture is heated under $N_2$ to 120° C. and stirred for 20 hours at this temperature. The reaction product (a brown viscous liquid) is dissolved in methylene chloride and the solution is extracted with a 5% aqueous solution of $NaHCO_3$. The organic phase is concentrated under vacuum to give a yellow liquid.

Yield: 25.3 g (94.7% of theory);

$M_n=760$, $M_w=1000$;

COOH end group content: 1.46 eq./kg.

9.0 g of this carboxyl-terminated polyester (0.013 eq. of COOH), 3.66 g (0.0286 mol) of glycidyl acrylate, 0.09 g of tetraethylammonium bromide, 0.032 g of p-methoxyphenol and 25 ml of toluene are heated to 80° C. The solution is stirred until the epoxy value remains constant. The product is then precipitated from hexane.

Yield: 5.3 g (49% of theory);

$M_n=923$, $M_w=2\,300$;

double bond value: 1.68 eq./kg.

Polyester VIII 13.02 g (0.1 mol) of butyl glycidyl ether are mixed with 18.48 g (0.12 mol) of hexahydrophthalic anhydride and 0.16 g (0.001 mol) of the disodium salt of succinic acid under $N_2$. The mixture is heated under $N_2$ to 140° C. and stirred for 34 hours at this temperature. The reaction product is dissolved in methylene chloride and precipitated with 300 ml of ether. The precipitate is dried to give a white powder.

Yield: 11.6 g (34.6% of theory);

$M_n$=4 500, $M_w$=7 200;

COOH end group content: 0.35 eq./kg.

9.0 g of this carboxyl-terminated polyester (0.031 eq. of COOH), 0.9 g (0.007 mol) of glycidyl acrylate, 0.09 g of tetraethylammonium bromide, 0.032 g of p-methoxyphenol and 25 ml of toluene are heated to 90° C. The solution is stirred until the epoxy value remains constant. The product is then precipitated from hexane.

Yield: 6.3 g (67% of theory);

$M_n$=3000, $M_w$=9000;

double bond value: 0.23 eq./kg.

Polyester IX

In a dry round flask, 13.02 g (0.1 mol) of butyl glycidyl ether are mixed with 15.41 g (0.1 mol) of hexahydrophthalic anhydride, 0.16 g (0.001 mol) of the disodium salt of succinic acid and 0.3 g of nitrobenzene under $N_2$. The mixture is heated under $N_2$ to 80° C. and stirred for 24 hours at this temperature. Then 6.4 g (0.05 mol) of glycidyl acrylate are added and stirring is continued for another 24 hours. The product is subsequently precipitated from hexane and then reprecipitated from methylene/hexane (1:1), giving a light brown viscous resin.

$M_n$=6 500, $M_w$=29 500;

double bond value: 0.87 eq./kg.

Polyester X 25 g of polyethylene glycol 2000 (0.025 eq. of OH) are dissolved in 30 ml of dry dioxane. Then 4.5 g of a 30% suspension of sodium in toluene are added and the mixture is stirred for 1 hour at room temperature. This mixture us filtered under $N_2$. To the filtrate are added 18.5 g of phthalic anhydride (0.125 mol), 9.38 g of phenyl glycidyl ether (0.0625 mol), 8.0 g of glycidyl acrylate (0.0625 tool) and 0.4 g of nitrobenzene and the mixture is stirred for 24 hours under $N_2$ at 80° C. The product is precipitated with ether and reprecipitated from methylene chloride/hexane (1:1).

$M_n$=2 960, $M_w$=5 070.

Polyester XI 25 g of Desmophen® 1600 U [linear polyol available from Bayer AG, (0.05 eq. of OH)] are dissolved in 25 ml of dry dioxane. Then 4.5 g of a 30% suspension of sodium in toluene are added and the mixture is stirred at room temperature until a clear solution forms. Then 29.62 g of phthalic anhydride (0.2 mol), 15.02 g of phenyl glycidyl ether (0.1 mol), 12.81 g of glycidyl acrylate (0.1 mol) and 0.8 g of nitrobenzene are added, and the mixture is stirred for 48 hours under $N_2$ at 80° C. The product is dissolved in methylene chloride and precipitated with ether.

Yield: 44.5 g (48% of theory);

$M_n$=3 200, $M_w$=12 100;

double bond value: 0.88 eq./kg.

Polyester XII

The procedure of Example XI is repeated, but replacing phenyl glycidyl ether with 13.02 g of butyl glycidyl ether (0.1 tool). The product is reprecipitated from methylene chloride/hexane (1:1).

Yield: 54.35 g (67.6% of theory);

$M_n$=1 800, $M_w$=500;

double bond value: 0.89 eq./kg.

Polyester XIII 25 g of polytetrahydrofuran 1000 (0.05 eq. of OH) are dissolved in 200 ml of dry toluene. Then 3.83 g of a 30% suspension of sodium in toluene are added and the mixture is stirred for 1 hour at room temperature until a clear solution forms. Then 37.02 g of phthalic anhydride (0.25 mol), 18.8 g of phenyl glycidyl ether (0.125 mol), 15.98 g of glycidyl acrylate (0.125 mol) and 1 g of nitrobenzene are added, and the mixture is stirred for 48 hours under $N_2$ at 80° C. The product is precipitated with hexane.

Yield: 75.3 g (78% of theory);

$M_n$=2 800, $M_w$=3 900.

Polyester XIV

In accordance with the procedure described in Example I, the following components are mixed in a dry round flask under $N_2$:

| | |
|---|---|
| 20.0 g | of phenyl glycidyl ether (0.133 mol) |
| 9.38 g | of glycidyl methacrylate (0.066 mol) |
| 29.45 g | of phthalsäureanhydrid (0,199 mol) |
| 0.32 g | of 1-methylimidazole (0.004 mol) |
| 50 ml | of toluene |
| 1.14 g | of nitrobenzene. |

The solution is stirred for 24 hours under $N_2$ at 80° C. The very viscous solution is then diluted with 100 ml of methylene chloride and the product is precipitated with 500 ml of ether. The oily yellow product is reprecipitated from methylene chloride/ether (1:1) and dried, giving a white powder.

Yield: 40.5 g (67.5% of theory);

$M_n$=10 700, $M_w$=14 200;

double bond value: 0.8 eq./kg.

Polyester XV

In accordance with the procedure described in Example 1, the following components are mixed in a dry round flask under $N_2$:

| | |
|---|---|
| 13.3 g | of butyl oxirane (0.133 mol) |
| 8.51 g | of glycidyl acrylate (0.066 mol) |
| 29.45 g | of hexahydrophthalic anhydride (0.21 mol) |
| 0.32 g | of 1-methylimidazole (0.004 mol) |
| 50 ml | of toluene. |
| 0.60 g | of nitrobenzene. |

The solution is stirred for 24 hours under $N_2$ at 80° C. The product is then extracted with a 5% aqueous solution of NaHCO3 and the organic phase is concentrated under vacuum, giving a yellowish viscous resin.

Yield: 50.2 g (90.7% of theory);

$M_n$=1 330, $M_w$=1 840.

13
II. Production of 3D Objects

Example 1

5 g of a polyester according to Example XIV with a double bond value of 0.8 eq/kg are stirred with 5 g of N-vinylpyrrolidone and 0.4 g of 1-hydroxycyclohexyl phenyl ketone (Irgacure® 184, ex Ciba-Geigy) at 40° C. until a homogeneous, clear solutions forms. Three-dimensional objects are produced using a He/Cd laser. After the laser cure (green objects), these objects have the following properties:

| | |
|---|---|
| modulus of elasticity: | 2–3 N/mm² |
| (modulus of elasticity according to DIN 53 371; green strength); | |
| ultimate strength $\sigma_{max}$: | 1 N/mm² |
| (DIN 53 455); | |
| elongation at break $\epsilon$: | 41% |
| (DIN 35 455); | |

To effect the full cure, the green objects are irradiated for 30 minutes with UV/VIS light. The objects then have the following properties:

| | |
|---|---|
| modulus of elasticity: | 231 N/mm²; |
| ultimate strength $\sigma_{max}$: | 14 N/mm²; |
| elongation at break $\epsilon$: | 28%. |

Example 2

35 g of a polyester according to Example II with a double bond value of 0.8 eq/kg are stirred with 35 g of polyethylene glycol 400 diacrylate (SR 344®, ex Sartomer), 25 g of trimethylolpropane triacrylate and 5 g of 1-hydroxycyclohexyl phenyl ketone (Irgacure® 184, ex Ciba-Geigy) at 40° C. until a homogeneous, clear solutions forms.

Three-dimensional objects are produced using a He/Cd laser. After the laser cure (green objects), these objects have the following properties:

| | |
|---|---|
| modulus of elasticity: | 17 N/mm² |
| (modulus of elasticity according to DIN 53 371; green strength); | |
| ultimate strength $\sigma_{max}$: | 3 N/mm² |
| (DIN 53 455); | |
| elongation at break $\epsilon$: | 16% |
| (DIN 35 455); | |

To effect the full cure, the green objects are irradiated for 30 minutes with UV/VIS light. The objects then have the following properties:

| | |
|---|---|
| modulus of elasticity: | 665 N/mm²; |
| ultimate strength $\sigma_{max}$: | 21 N/mm²; |
| elongation at break $\epsilon$: | 3% |
| Shore D-hardness: | 70. |

14
Examples 3–13

In accordance with the general procedure described in Example 1, formulations are prepared from the components indicated in Table 1 and processed to moulded objects and boards under the conditions described in Examples 1 and 2. The amounts in Table 1 are given in percentages by weight, based on the total weight of the appropriate formulation. The properties of the moulded articles are given in Table 2.

TABLE 1

| | Example | | | | | | | | | | |
|---|---|---|---|---|---|---|---|---|---|---|---|
| | 3 | 4 | 5 | 6 | 7 | 8 | 9 | 10 | 11 | 12 | 13 |
| polyester of Ex. III | 35 | 35 | | | | | | | | | |
| polyester of Ex. VI | | | 35 | | | | | | | | |
| polyester of Ex. IV | | | | 35 | | | | | | | |
| polyester of Ex. VIII | | | | | 20 | | | | | | |
| polyester of Ex. X | | | | | | 35 | | | | | |
| polyester of Ex. XI | | | | | | | 35 | | | | |
| polyester of Ex. XII | | | | | | | | 35 | | | |
| polyester of Ex. XV | | | | | | | | | 20 | | |
| polyester of Ex. IV | | | | | | | | | | 20 | 40 |
| SR 344[1] | 35 | | | | | | | | 14.85 | 20 | 20 |
| SR 351[1] | | 25 | 25 | 25 | 50 | 25 | 25 | 25 | | | |
| SR 350[1] | 25 | | | | | | | | | | |
| SR 230[1] | | 35 | 35 | 35 | 25 | 35 | 35 | 35 | | | |
| SR 339[1] | | | | | | | | | | 10 | 10 |
| SR 348[1] | | | | | | | | | 20 | 24.85 | 24.85 |
| SR 9640[1] | | | | | | | | | 40 | 20 | |
| 4-methoxyphenol | | | | | | | | | 0.15 | 0.15 | 0.15 |
| Irgacure 184[1] | 5 | 5 | 5 | 5 | 5 | 5 | 5 | 5 | 5 | 5 | 5 |

[1]
SR 344: polyethylene glycol 400 diacrylate (Sartomer)
SR 350: trimethylolpropane trimethacrylate (Sartomer)
SR 351: trimethylolpropane triacrylate (Sartomer)
SR 230: diethylene glycol diacrylate (Sartomer)
SR 339: phenoxyethyl acrylate (Sartomer)
SR 348: ethoxylated dimethyl acrylate of bisphenol A
SR 9640: aliphatic urethane acrylate (Sartomer)
Irgacure 184: 1-hydroxycyclohexyl phenyl ketone (Ciba-Geigy)

TABLE 2

| | Example | | | | | | | | | | |
|---|---|---|---|---|---|---|---|---|---|---|---|
| | 3 | 4 | 5 | 6 | 7 | 8 | 9 | 10 | 11 | 12 | 13 |
| $\eta$ (35° C.) (mPa · s) | 1970 | 795 | 43 | 35 | 151 | 1420 | 3760 | 113 | 3810[4] | 1090[4] | 1740[4] |
| mod. of elasticity (N/mm²)[2] | 1.2 | 66 | 12.4 | 8.5 | 51.9 | 35 | 23.7 | 17 | 2.44 | 1.94 | 1.76 |

TABLE 2-continued

| | Example | | | | | | | | | | |
|---|---|---|---|---|---|---|---|---|---|---|---|
| | 3 | 4 | 5 | 6 | 7 | 8 | 9 | 10 | 11 | 12 | 13 |
| $\sigma_{max}$ (N/mm$^2$)[2] | 0.1 | 1.9 | 0.6 | 0.6 | 3.2 | 3.7 | 3.2 | 2.0 | 0.43 | 0.25 | 0.46 |
| $\epsilon$ (%)[2] | 9 | 4.1 | 4.9 | 6.2 | 7.7 | 12 | 13.1 | 11.7 | 15.8 | 13.4 | 23 |
| mod. of elasticity (N/mm$^2$)[3] | 610 | 1650 | 599 | 648 | 2510 | 2080 | 1980 | 1160 | 26.4 | 334 | 257 |
| $\sigma_{max}$ (N/mm$^2$)[3] | 21 | 54 | 17 | 15.7 | 26.7 | 42.9 | 46.7 | 24.4 | 7.5 | 18.3 | 11.6 |
| $\epsilon$ (%)[3] | 10 | 2.9 | 6 | 4.2 | 1.2 | 3.7 | 2.6 | 3.8 | 23.6 | 24.6 | 13.5 |

[2] values after laser cure (40 mJ/cm$^2$)
[3] values after full cure
[4] viscosity at 30° C.

What is claimed is:

1. A photosensitive composition for production of a three-dimensional object by means of a stereolithographic process comprising a) 5–95% by weight of a polyester of formula II or III

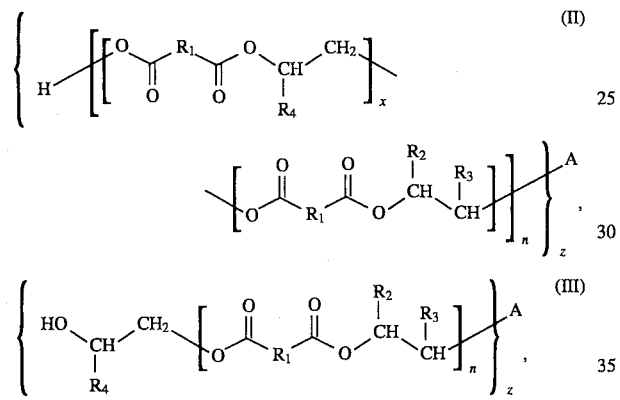

wherein $R_1$ is the radical of a cyclic anhydride of a dicarboxylic acid after removal of the —O—CO—O— grouping, which radical may be substituted by $C_1$–$C_{22}$alkyl, $C_5$–$C_{10}$cycloalkyl, $C_3$–$C_6$alkenyl, $C_6$–$C_{10}$aryl, halogen or $C_1$–$C_{22}$alkyl which is interrupted by —O— or —CO—O—, $R_2$ is hydrogen, unsubstituted or halogen-substituted $C_1$–$C_{22}$alkyl, $C_5$–$C_{10}$cycloalkyl, $C_7$–$C_{12}$aralkyl, $C_6$–$C_{10}$aryl or a radical —CH$_2$—O—R$_5$ or —CH$_2$—O—CO—R$_5$, wherein $R_5$ is $C_1$–$C_{22}$alkyl, $C_5$–$C_6$cycloalkyl or $C_6$–$C_{10}$aryl, $R_3$ is hydrogen, or $R_2$ and $R_3$, together with the linking carbon atoms, are a cyclopentylene or cyclohexylene radical, $R_4$ is a radical of 4 to 12 carbon atoms which carries an unsaturated end group and carboxyl or ether groups, wherein A in formulae II and III is a radical H$_3$C—(CH$_2$)$_y$—CO—O—, H$_3$C—(CH$_2$)$_y$—O—, —O—CO—(CH$_2$)$_y$—CO—O—, —O—(CH$_2$)$_y$—O— or

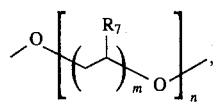

wherein $R_7$ is methyl or hydrogen if m=1 or, if m=2–4, is hydrogen, n=2–150 and y is an integer from 2–20, or wherein A is derived from a linear or branched polyethylene glycol or polypropylene glycol or a copolymer of these two glycols or a carboxyl-terminated polyester, x is an integer from 0–100, n is an integer from 2–150, and z is an integer from 1–4, b) 10–90% by weight of a liquid polyfunctional aliphatic, cycloaliphatic or aromatic (meth)acrylate, which is a mixture of a di(meth)acrylate and a tri(meth)acrylate, c) 0–70% of a mono(meth)acrylate or mono-N-vinyl compound with a molecular weight of not more than 500, d) 0.1–10% by weight of a photoinitiator, and e) 0–10% by weight of optional customary additives.

2. A photosensitive composition according to claim 1, comprising a) 30–80% by weight of a polyester of formula I, II or III, b) 20–70% by weight of a liquid polyfunctional aliphatic, cycloaliphatic or aromatic (meth)acrylate, c) 0–50% by weight of a mono(meth)acrylate or mono-N-vinyl compound with a molecular weight of not more than 500, d) 0.5–7% by weight of a photoinitiator, and e) 0–5% by weight of optional customary additives.

3. A photosensitive composition according to claim 1, wherein $R_1$ in formulae I, II and III is a radical of formula

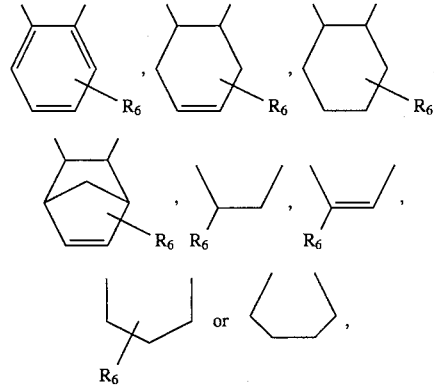

wherein $R_6$ is hydrogen, $C_1$–$C_{22}$alkyl, $C_5$–$C_{10}$cycloalkyl, $C_3$–$C_6$alkenyl, $C_6$–$C_{10}$aryl, halogen or $C_1$–$C_{22}$alkyl which is interrupted by —O— or —CO—O—.

4. A photosensitive composition according to claim 3, wherein $R_1$ is a radical of formula

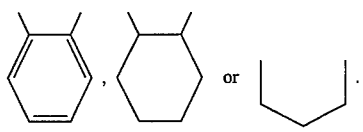

5. A photosensitive composition according to claim 1, wherein $R_2$ in formulae I, II and III is hydrogen, methyl, n-butyl, $H_3C—(CH_2)_3—O—CH_2—$ or a radical of formula

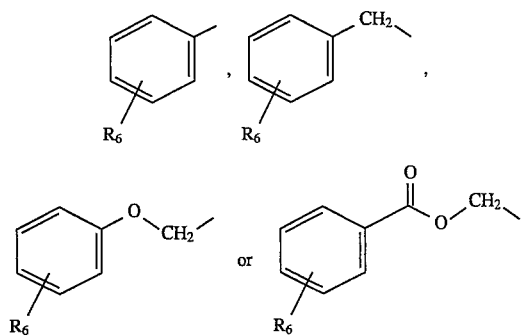

or wherein $R_2$ and $R_3$, when taken together, form an unsubstituted or $R_6$-substituted tetramethylene radical, wherein $R_6$ is as defined in claim 3.

6. A photosensitive composition according to claim 5, wherein $R_2$ is n-butyl, $H_3C—(CH_2)_3—O—CH_2—$ or a radical of formula

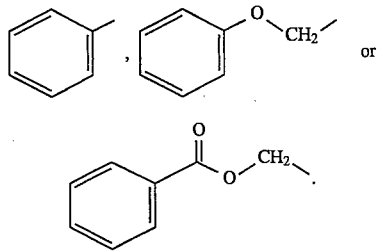

7. A photosensitive composition according to claim 1, wherein $R_4$ in formulae I, II and III is a radical of formula

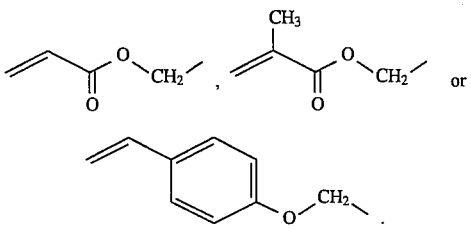

8. A polyester of formula II or III according to claim 1, wherein the substituents $R_1$, $R_2$, $R_3$, $R_4$, $R_5$ and A, as well as x, n and z are as defined in claim 1.

9. A photosensitive composition according to claim 1, wherein component c) is a mono-N-vinyl compound.

10. A photosensitive composition according to claim 9, wherein component c) is N-vinylpyrrolidone.

11. A photosensitive composition according to claim 1, wherein component d) is 1-hydroxyphenyl ketone.

12. A photosensitive composition according to claim 1, wherein component d) is 1-hydroxycyclohexyl phenyl ketone.

13. A process for polymerising a composition as claimed in claim 1, which comprises irradiating said composition with actinic light.

14. A process for the production of a three-dimensional object from the a composition according to claim 1 by a lithographic method, wherein a layer of said composition is irradiated over the entire surface or in a predetermined pattern with a UV/VIS light source, such that within the irradiated areas a layer solidifies in a desired layer thickness, then a new layer of said composition is formed on the solidified layer, which is likewise irradiated over the entire surface or in a predetermined pattern, and such that a three-dimensional object is formed from a plurality of solidified layers which adhere to one another by repeated coating and irradiation.

15. A process according to claim 14, wherein a laser beam, preferably a computer-controlled laser beam, is used as source of irradiation.

* * * * *